US012341529B2

(12) United States Patent  
Wang et al.

(10) Patent No.: US 12,341,529 B2  
(45) Date of Patent: Jun. 24, 2025

(54) D/A CONVERTER WITH RESISTIVE INTERPOLATION

(71) Applicant: Trustees of Tufts College, Medford, MA (US)

(72) Inventors: Wei Wang, Colorado Springs, CO (US); Sameer Sonkusale, Lincoln, MA (US)

(73) Assignee: Trustees of Tufts College, Medford, MA (US)

( * ) Notice: Subject to any disclaimer, the term of this patent is extended or adjusted under 35 U.S.C. 154(b) by 0 days.

(21) Appl. No.: 18/022,666

(22) PCT Filed: Aug. 25, 2021

(86) PCT No.: PCT/US2021/047440  
§ 371 (c)(1),  
(2) Date: Feb. 22, 2023

(87) PCT Pub. No.: WO2022/046832  
PCT Pub. Date: Mar. 3, 2022

(65) Prior Publication Data  
US 2023/0353165 A1 Nov. 2, 2023

Related U.S. Application Data

(60) Provisional application No. 63/069,809, filed on Aug. 25, 2020.

(51) Int. Cl.  
*H03M 1/68* (2006.01)  
*H03M 1/76* (2006.01)

(52) U.S. Cl.  
CPC .............. *H03M 1/68* (2013.01); *H03M 1/76* (2013.01)

(58) Field of Classification Search  
CPC .................................. H03M 1/68; H03M 1/76  
USPC ........................................ 341/126, 144, 145  
See application file for complete search history.

(56) References Cited

U.S. PATENT DOCUMENTS

| 6,246,351 | B1 * | 6/2001 | Yilmaz | ............... H03M 1/0682 341/145 |
| 7,796,060 | B2 * | 9/2010 | Oberhuber | .............. H03M 1/06 341/94 |
| 2006/0176203 | A1 | 8/2006 | Grosso et al. | |
| 2008/0186215 | A1 | 8/2008 | Brubaker | |
| 2009/0167583 | A1 | 7/2009 | Iorga et al. | |
| 2009/0295767 | A1 | 12/2009 | Tsuchi | |
| 2014/0347202 | A1 | 11/2014 | Price et al. | |

OTHER PUBLICATIONS

International Search Report and Written Opinion, PCT Application No. PCT/US2021/047440, mailed Nov. 8, 2021 (14 pages).

* cited by examiner

*Primary Examiner* — Khai M Nguyen  
(74) *Attorney, Agent, or Firm* — Occhiuti & Rohlicek LLP (57) ABSTRACT

A digital-to-analog converter that outputs an analog value representing a digital value includes a decoding stage and an interpolation stage. The decoding stage defines upper and lower bounds and the interpolation stage outputs an interpolated value that is between the upper and lower bounds. The upper and lower bounds are based on a most-significant portion of the digital value. The interpolation stage selects the interpolated value based on the least-significant portion of the digital value.

20 Claims, 6 Drawing Sheets

FIG. 1

| $D_3$ | $D_2$ | $D_1$ | $D_0$ | $V_4$ | $V_3$ | $V_2$ | $V_1$ | $V_0$ | $V_{out}$ |
|---|---|---|---|---|---|---|---|---|---|
| 0 | 0 | 0 | 0 | VL | VL | VL | VL | VL | VL |
| 0 | 0 | 0 | 1 | VL | VL | VL | VH | VL | VL+ΔV/16 |
| 0 | 0 | 1 | 0 | VL | VL | VH | VL | VL | VL+2ΔV/16 |
| 0 | 0 | 1 | 1 | VL | VL | VH | VH | VL | VL+3ΔV/16 |
| . | . | . | . | . | . | . | . | . | . |
| . | . | . | . | . | . | . | . | . | . |
| 1 | 1 | 0 | 1 | VH | VH | VL | VH | VL | VL+13ΔV/16 |
| 1 | 1 | 1 | 0 | VH | VH | VH | VL | VL | VL+14ΔV/16 |
| 1 | 1 | 1 | 1 | VH | VH | VH | VH | VL | VL+15ΔV/16 |

| $D_3$ | $D_2$ | $D_1$ | $D_0$ | $V_4$ | $V_3$ | $V_2$ | $V_1$ | $V_{out}$ | $I_{out}$ |
|---|---|---|---|---|---|---|---|---|---|
| 0 | 0 | 0 | 0 | VL | VL | VL | VL | VL | $VL/R_2$ |
| 0 | 0 | 0 | 1 | VL | VL | VL | VH | $VL+\Delta V/16$ | $(VL+\Delta V/16)/R_2$ |
| 0 | 0 | 1 | 0 | VL | VL | VH | VL | $VL+2\Delta V/16$ | $(VL+2\Delta V/16)/R_2$ |
| 0 | 0 | 1 | 1 | VL | VL | VH | VH | $VL+3\Delta V/16$ | $(VL+3\Delta V/16)/R_2$ |
| . | . | . | . | . | . | . | . | . | . |
| . | . | . | . | . | . | . | . | . | . |
| . | . | . | . | . | . | . | . | . | . |
| 1 | 1 | 0 | 1 | VH | VH | VL | VH | $VL+13\Delta V/16$ | $(VL+13\Delta V/16)/R_2$ |
| 1 | 1 | 1 | 0 | VH | VH | VH | VL | $VL+14\Delta V/16$ | $(VL+14\Delta V/16)/R_2$ |
| 1 | 1 | 1 | 1 | VH | VH | VH | VH | $VL+15\Delta V/16$ | $(VL+15\Delta V/16)/R_2$ |

D/A CONVERTER WITH RESISTIVE INTERPOLATION

RELATED APPLICATIONS

This application is a 371 national stage application of International Application No. PCT/US2021/047440, filed Aug. 25, 2021, which claims the benefit of the Aug. 25, 2020 priority date of U.S. Provisional Application 63/069,809, the contents of which are herein incorporated by reference.

FIELD OF DISCLOSURE

The invention relates to digital-to-analog converters

BACKGROUND

A "DAC," also known as a "D/A converter" or a "digital-to-analog converter," provides a mapping between a domain of discrete numbers into a range of continuous voltage values. Known ways of achieving this typically include passing currents through resistors to develop voltages that correspond to the various bit values and then adding these voltages together to obtain an analog voltage output.

An IoT device typically relies on a DAC for actuating various devices, such as a light, a valve, a pump, a heater, or any of a variety of appliances. One feature of IoT devices is that the DAC does not have to operate all that quickly. Thus, a DAC for use in an IoT device can use resistor strings.

In a DAC that uses resistor strings, the resolution of the DAC depends on the number of resistors. Thus, high resolution requires many more resistors and switches. This increases the circuit's footprint on a chip. In fabrication of integrated circuits, cost of manufacture depends greatly on the area of a circuit. It is therefore useful to minimize the circuit's area.

SUMMARY

In one aspect, the invention features a digital-to-analog converter that provides an analog output that represents a digital value, the digital value having a most-significant portion and a least-significant portion. The digital-to-analog converter includes a decoding stage and an interpolation stage. The decoding stage defines upper and lower bounds. The interpolation stage outputs an interpolated value that is between the upper and lower bounds. The decoding stage defines the upper and lower bounds based on the most-significant portion. The interpolation stage selects the interpolated value based on the least-significant portion.

In some embodiments, the decoding stage includes a decoder that is configured to output a high voltage and a low voltage. The high and low voltages define the upper and lower bounds, respectively.

In other embodiments, the decoding stage includes a multiplexer that outputs a vector. The multiplexer uses the least-significant portion as a basis for selecting which elements of the vector are to be set to the upper bound and which of the elements of the vector are to be set to the lower bound.

In still other embodiments, the decoding stage is configured to encode the least-significant portion into an output vector of voltages whose values are based on the most-significant portion.

In any of the foregoing embodiments, the most-significant portion and the least-significant portion comprise bit strings.

Among the embodiments are those in which the upper and lower bounds define a range and the analog output is one of a set of analog values that are within the range. The analog values in this set are separated by a minimum step size that depends on the number of possible values of the least-significant portion.

Also among the embodiments are those in which wherein the interpolation stage includes first and second summation circuits having outputs that connect to inputs of a differential amplifier. In such embodiments, the first summation circuit outputs a voltage that is based on the least-significant portion and the second summation circuit outputs a voltage that is based on an output of the differential amplifier.

In still other embodiments, the interpolation stage includes a summation circuit that outputs a sum of voltages at a plurality of nodes. These nodes comprise a first node in series with a first resistance and a second node in series with a second resistance that is less than the first resistance. The first node is assigned to a first bit in the least-significant portion and the second node is assigned to a second bit in the least-significant portion, with the first bit being of greater significance than the second bit. As a result, when a first current passes through the first node and a second current having the same value as the first current passes through the second node, voltages at the first and second nodes differ from each other.

In still other embodiments, the interpolation stage includes a plurality of current paths, each of which corresponds to an element of vector received from the decoding stage. These current paths carry currents based on the elements of the vector. Each current path includes a resistor, with the resistors having different values of resistance.

Also among the embodiments are those in which the interpolation stage includes a summation circuit that receives, at each input thereof, a voltage that depends on a value of a corresponding element of a vector defined by the least-significant portion.

In some embodiments, the interpolation stage includes a first summation circuit and a second summation circuit/The first summation circuit receives, for each value of a voltage vector, a voltage that depends on a value of a resistance that is associated with a corresponding element of the voltage vector. The second summation circuit receives, at each input thereof, a voltage that depends at least in part on the value of the resistance.

In still other embodiments, the interpolation stage includes first and second resistors. A first current passes through the first resistor to generate a first voltage and a second current passes through the second resistor to generate a second voltage. The first current depends on a voltage at a first element of the vector and the second current depends on a voltage at a second element of the vector.

Also among the embodiments are those in which the interpolation stage includes first and second resistors. In such embodiments, a first current passes through the first resistor to generate a first voltage and a second current passes through the first and second resistors to generate a second voltage that is greater than the first voltage. The second resistor has a value that is double that of the first resistor. The first current depends on a voltage of a first element of a vector that encodes the least-significant portion and the second current has a value that depends on a voltage of a second element of the vector.

Also among the embodiments are those in which the interpolation stage includes a differential amplifier, first summation circuitry, a first set of resistors and a first set of nodes. Each resistor in the first set of resistors has a resistance that corresponds to a significance of a bit in the least-significant portion. As a result, in operation, each node in the first set of nodes has a voltage value that depends on a value of a corresponding one of the bits in the least-significant portion and a significance of the bit. In such embodiments, the first summation circuitry is configured to provide a sum of the voltage values at the nodes to a first input of the differential amplifier. The interpolation stage further includes second summation circuitry, a second set of resistors, and a second set of nodes. Each resistor in the second set of resistors has a resistance that corresponds to a significance of a bit in the least-significant portion. The second summation circuitry is configured to provide a sum of voltages at nodes in the second set of nodes to a second input of the differential amplifier. Each node in the second set of nodes has a voltage value that depends on a current that is driven through a corresponding resistor that is connected to the node by a voltage provided by an output of the differential amplifier.

Still other embodiments include those in which the interpolation stage has a string of resistors with pairs of resistors in the string being joined at nodes. Each of the nodes is configured to receive an injection of current based on a value of the least-significant portion.

Embodiments further include those in which a string of resistors in the interpolation stage includes resistors having different resistances. The string includes a node such that a resistance between the node and ground is the sum of all resistances of the resistors. A voltage measured at this node is indicative of a value of the least-significant portion.

Yet other embodiments include those in which the interpolation stage includes a string and gates. The string includes a first resistor, a second resistor, a third resistor, a first node that is between the first resistor and the second resistor, and a second node that is between the second resistor and the third resistor. Each of the gates controls current flow through a corresponding transistor. Each of the gates is also controlled by a corresponding element of a vector of analog values provided by the decoding stage. Among the gates are first and second gates that control flow of current into first and second nodes, respectively. The flow of the current into the first and second nodes depends on a value encoded by the least-significant portion.

Embodiments also include those in which the interpolation stage includes an amplifier that outputs a difference between first and second inputs thereof from which the analog output of the digital-to-analog converter is derived.

Still other embodiments include those in which the interpolation stage includes a current source, a differential amplifier, a first string, a first transistor-set, a second string, and a second transistor-set. The first string includes resistors and nodes between the resistors, with each resistor in the string having a resistance that corresponds to a significance of a bit in the least-significant portion. The first transistor-set includes transistors, each of which corresponds to a bit in the least-significant portion and each of which selectively injects current provided by the current source into a corresponding one of the nodes of the first string in response to a value of a corresponding bit in the least-significant portion. The highest voltage in the first string is provided as a first input to the differential amplifier. Like the first string, the second string includes resistors and nodes between the resistors. As was the case with the first string, each resistor in the second string has a resistance that corresponds to a significance of a bit in the least-significant portion. Like the first transistor-set, the second transistor-set also includes transistors, each of which corresponds to a bit in the least-significant portion and each of which selectively injects current provided by the current source into a corresponding one of the nodes of the second string. However, the second transistor-set does so in response to an output of the differential amplifier. A highest voltage in the highest voltage in the second string is provided as a second input to the differential amplifier.

In other embodiments, the interpolation stage includes a current source, a gain stage, a first string, a first transistor-set, a second string, and a second transistor-set, with the gain stage including first and second input transistors and an output transistor through which flows an output current that is indicative of the digital value. The first and second strings both include resistors and nodes between the resistors, with each resistor in the string having a resistance that corresponds to a significance of a bit in the least-significant portion. The first and second transistor-sets both include transistors, each of which corresponds to a bit in the least-significant portion and each of which selectively injects current provided by the current source into a corresponding one of the nodes of the first string and second string, respectively. The first transistor-set does so in response to a value of a corresponding bit in the least-significant portion. The second transistor-set does so in response the differential amplifier's output. A highest voltage of the nodes in the first string drives a first input transistor of the gain stage and a highest voltage of the nodes in the second string drives a second input transistor of the gain stage. An output voltage at the output transistor's source terminal drives the transistors in the second transistor-set.

In still other embodiments, the interpolation stage includes a differential amplifier, a first multiplexer, a second multiplexer, a first string, and a second string. The first and second strings both include resistors and nodes between the resistors. Both multiplexers receive the least-significant portion. The multiplexers each have plural outputs. Those of the first multiplexer connect corresponding nodes in the first and those of the second multiplexer connect to corresponding nodes in the second string. The first multiplexer receives first and second analog currents that correspond to the upper and lower bounds. A value encoded by the least-significant bits controls into which of the nodes of the first string the first and second currents are to be injected, thereby causing a voltage that is provided to an inverting input of the differential amplifier. Meanwhile, the second multiplexer receives third and fourth analog currents, the third and fourth analog currents corresponding to the first and second currents after having been modulated by a voltage that depends on an output of the differential amplifier. The value encoded by the least-significant bits controls into which of the nodes of the second string the third and fourth currents are to be injected, thereby causing a voltage that is provided to a non-inverting input of the differential amplifier.

In another aspect, the invention provides an apparatus for providing an output voltage that represents a sum a first value and a larger second value includes first circuitry that receives a first representation of the first value and outputs a vector of voltage values. Each element in the vector is either a high or a low voltage. This vector thus provides a second representation of that first value. The apparatus includes second circuitry that receives a representation of the second value and uses it to define the high and low voltages. Third circuitry receives the vector and provides an output voltage that is based on the vector's voltage values. This output voltage is an analog representation of the original sum.

In another aspect, the invention features a method comprising converting a digital value into an analog value, the digital value having a most-significant portion and a least-significant portion. Converting the digital value into the analog value includes selecting upper and lower bounds based on the most-significant portion and selecting, based on the least-significant portion, an analog value that is between the upper and lower bounds.

These and other features of the invention will be apparent from the following detailed description and the accompanying figures, in which:

BRIEF DESCRIPTION OF THE FIGURES

FIGS. 3 and 4 show alternative interpolation stages;

DETAILED DESCRIPTION

Figure 1:
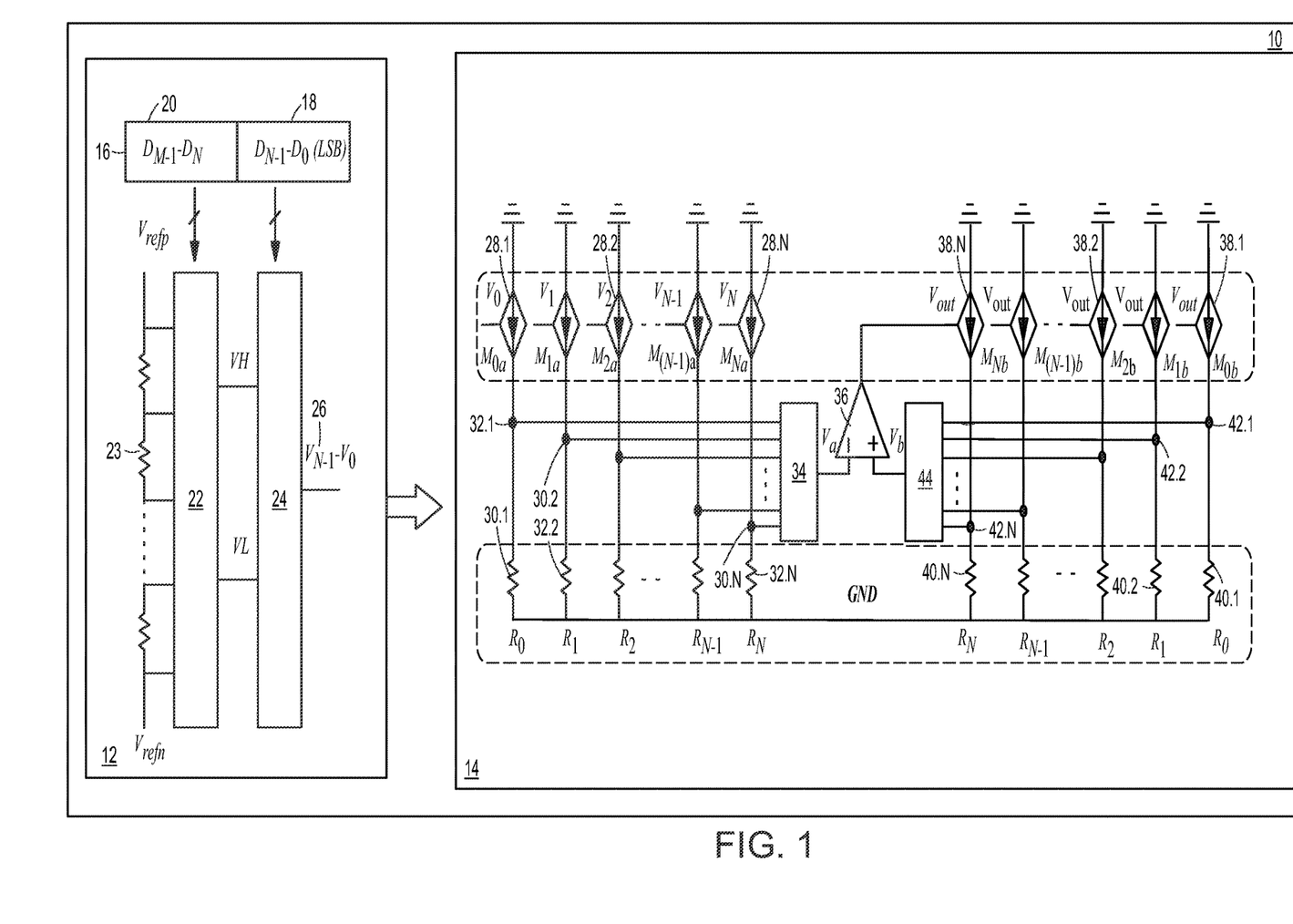
FIG. 1 shows a digital-to-analog converter having a decoding stage and an interpolation stage.

FIG. 1 shows a digital-to-analog converter 10 having a decoding stage 12 that couples to an interpolation stage 14. The connections between the decoding and interpolation stages 12, 14 are omitted for clarity but can be recognized by a common label.

The decoding stage 12 receives a digital value 16. It is this digital value 16 that digital-to-analog converter 10 is expected to convert into an analog output voltage $V_{OUT}$. The bits that encode this digital value 16 include first and second subsets 18, 20 of bits. These subsets 18, 20 of bits collectively include all of the bits that were used to encode the digital value 16. The first subset 18 includes those bits of lower significance. The second subset 20 includes those bits of higher significance.

As used herein, "significance" refers to the power of two that a bit is intended to represent. Thus, a bit that, when set, represents $2^3$ is said to be of higher "significance" than a bit that, when set, represents $2^2$. The notation used herein for bits uses "D" with a subscript that represents the relevant power of two. Thus, the bit $D_0$, when set, represents $2^0$.

In the illustrated embodiment, M bits, $D_{M-1}$-$D_0$, encode the digital value 16. The first subset 18 consists of N bits, namely $D_{N-1}$-$D_0$. The second subset 20 consists of M-N bits, namely $D_{M-1}$-$D_N$.

The first and second subsets 18, 20 are provided to different components of the decoding stage 12. In particular, the first subset 18 is provided to a multiplexer 24 and the second subset 20 is provided to a decoder 22.

Upon receiving the second subset 20, the decoder 22 outputs a first analog voltages VH and a second analog voltage VL that is less than the first analog voltage VH. The decoder 22 relies on a coarse resistor string 23 having as many resistors as there are bits in the second subset 20. In some embodiments, the resistors all have the same resistance.

The values of the first and second analog voltages VH, VL depend on the digital value encoded in the second subset 20. The decoder 22 can thus be thought of as a pair of digital-to-analog converters. The first of these digital-to-analog converters maps the value in the second subset 20 into the first analog voltage VH. The second of these two digital-to-analog converters maps the value in the second subset 20 into the second analog voltage VL.

The first and second analog voltages VH, VL together with the first subset 18 are provided to the multiplexer 24. The multiplexer 24 outputs an analog voltage vector 26. One element of the voltage vector 26 is always set to the second analog voltage VL. The remaining elements of this voltage vector 26 are set to either the first analog voltage VH or to the second analog voltage VL in a pattern that encodes the digital value represented by the first subset 18.

Figure 2:
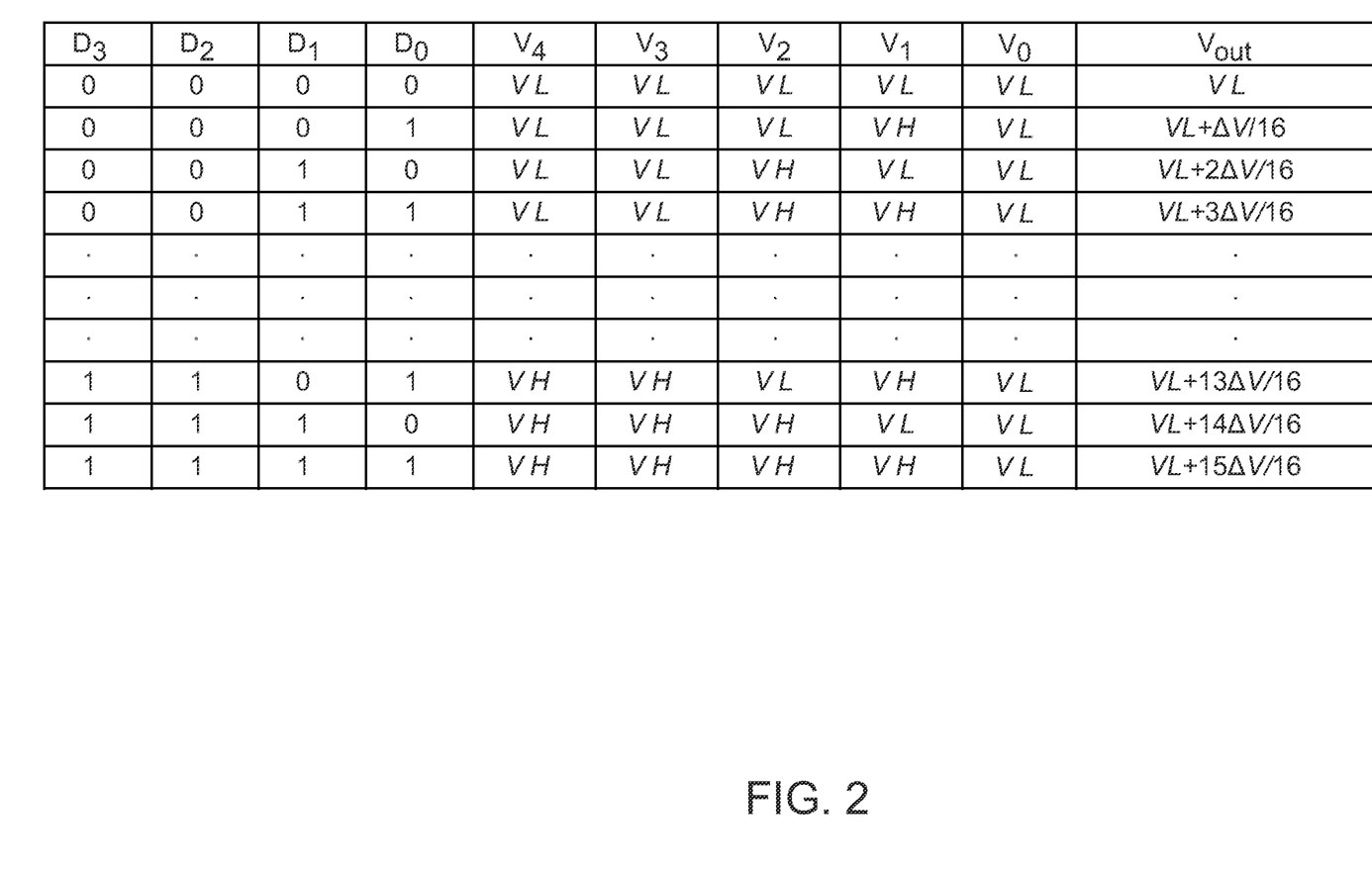
FIG. 2 shows a mapping of the less-significant bits from the digital value shown in FIG. 1.

FIG. 2 shows a particular example in which the first subset 18 consists of four bits, $D_3$-$D_0$. The elements of the voltage vector 26 are $V_4$-$V_0$. Each row of the table in FIG. 2 shows the elements of the voltage vector 26 that would correspond to a particular value in the four bits of the first subset 18. Not all possible values have been shown. However, enough have been shown so that the pattern is readily discernible. In particular, $V_N$ is equal to VL if $D_{N-1}$=0 and is equal to $V_H$ if $D_{N-1}$=1.

As is apparent from FIG. 2, the first element $V_0$ of the voltage vector 26 is always equal to the second analog voltage VL. The remaining elements $V_4$-$V_1$ encode the bits $D_3$-$D_0$ of the first subset 18.

The last column of the table shows the output $V_{OUT}$ of the digital-to-analog converter 10. The output of the digital-to-analog converter 10 is thus an interpolated analog voltage that is formed by adding an incremental voltage to the second analog voltage VL. This incremental voltage is a fraction of a voltage gap $\Delta V$ that separates the first and second analog voltages VH, VL. The interpolation stage 14 that follows the decoding stage 12 is what transforms the voltage vector 26 into the appropriate voltages shown in the last column of the table shown in FIG. 2.

Referring back to FIG. 1, in one embodiment, the interpolation stage 14 includes first current-sources 28.1-28.N, each of which is connected to an element of the voltage vector 26. Each of the first current-sources 28.1-28.N is connected to one of the first and second analog voltages VH, VL. Each of the first current-sources 28.1-28.N is a voltage-to-current conversion stage with a transconductance $g_m$. Each first current-source 28.1-28.N thus provides a current that depends on whatever voltage is present at the corresponding element of the voltage vector 26 to which it connects.

Each of the first current-sources 28.1-28.N passes current through a corresponding first resistor 30.1-30.N. The value of the first resistor 30.1-30.N associated with a particular first current-source 28.1-28.N depends on the significance of the bit that is represented by the particular element of the voltage vector 26 to which that first current-source 28.1-28.N is connected. This first resistor 30.1-30.N thus fixes a voltage at a first node 32.1-32.N that lies between the first current-source 28.1-28.N and the first resistor 30.1-30.N. The first resistor 30.1-30.N fixes that voltage at an appropriate value that corresponds to the significance of the bit to which its corresponding first current-source 28.1-28.N connects to in the voltage vector 26.

A first summation circuit 34 sums the voltages on the first nodes 32.1-32.N. The first summation circuit 34 thus defines the following voltage $V_A$.

$$V_A = \sum_{i=0}^{N} g_m V_i R_i$$

The output of the first summation circuit 34, which is the voltage V$_A$, connects to an inverting input of a differential amplifier 36. The output of the differential amplifier 36 controls second current-sources 38.1-38.N. Each of the second current-sources 38.1-38.N is a voltage-to-current conversion stage with a transconductance g$_m$.

Each second current source 38.1-38.N passes current through a corresponding second resistor 40.1-40.N, the values of which match corresponding ones of the first resistors 30.1-30.N. Each second resistor 40.1-40.N thus fixes a voltage at a second node 42.1-42.N, which is between the second current source 38.1-38.N and the second resistor 40.1-40.N, at an appropriate value.

The second nodes 42.1-42.N all connect to a second summation circuit 44. The second summation circuit 44 outputs a voltage V$_B$ that essentially buffers the output voltage V$_{OUT}$. The output of the second summation circuit 44 is given by:

$$V_B = \sum_{i=0}^{N} g_m V_{out} R_i$$

The second summing circuit's output V$_B$ connects to the non-inverting input of the differential amplifier 36. This connection completes a feedback loop. As a result of this feedback loop, the differential amplifier 36 attempts to maintain the outputs of the first and second summation circuits 34, 44 at the same value in an effort to stabilize the output of the digital-to-analog converter 10.

Figure 3:
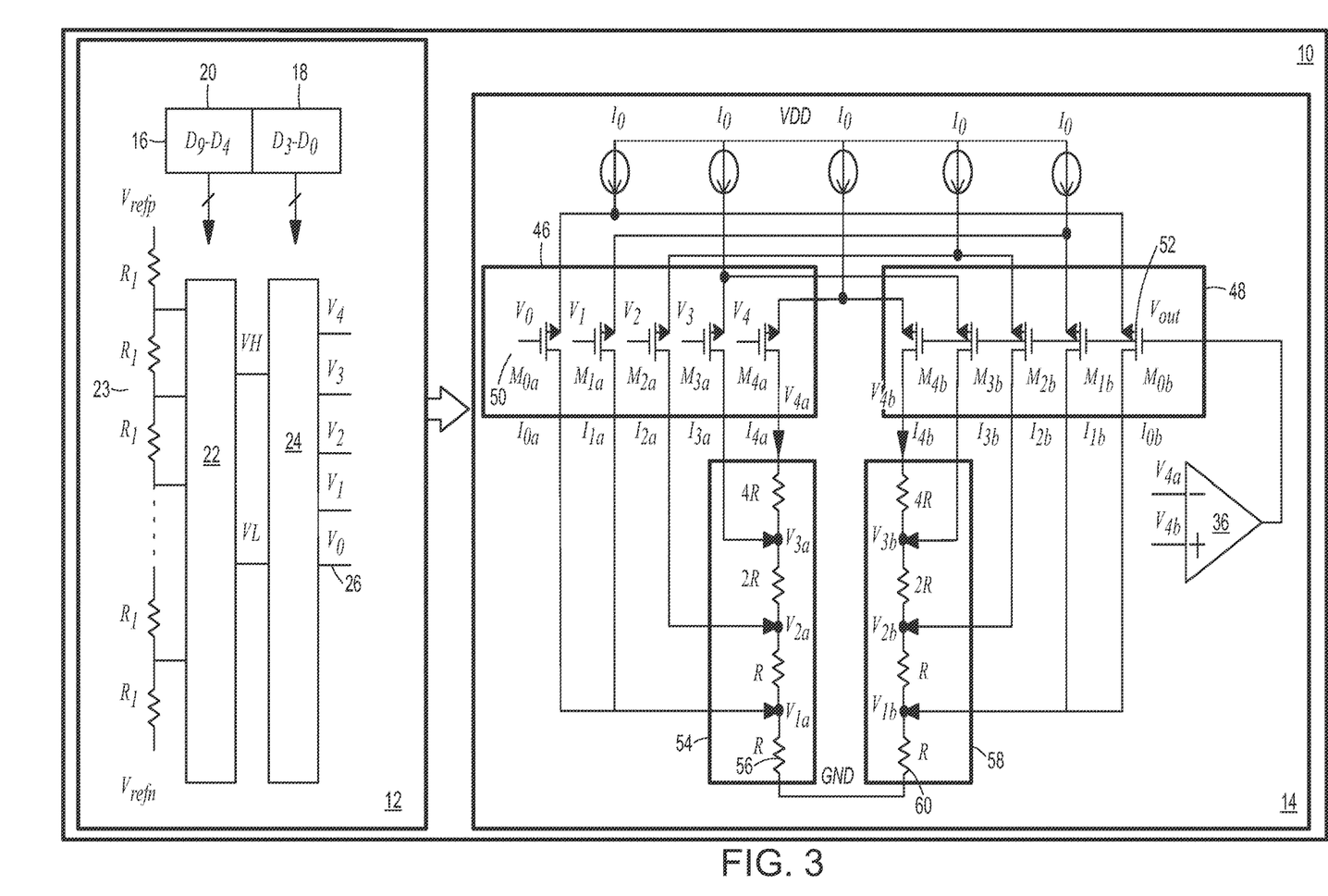

FIG. 3 shows another embodiment of the interpolation stage 14. In the example of FIG. 3, the digital value 16 has ten bits, of which four bits are in the first subset 18 and the remaining six bits are in the second subset 20.

The interpolation stage 14 includes first and second transistor-sets 46, 48. The first transistor-set 46 includes first transistors 50. The second transistor-set 48 includes second transistors 52. A constant current I$_0$ maintained by a rail voltage VDD is available to pass through the channels of the first transistors 50 and through the channels of the second transistors 52.

Each first transistor 50 in the first transistor-set 46 has its gate connected to a corresponding element of the voltage vector 26. Each element of the voltage vector 26 thus modulates the current passing through one of the first transistors 50 in the first transistor-set 46. Each second transistor 52 in the second transistor-set 48 has its gate connected to the output of a differential amplifier 36.

The interpolation stage 14 also includes a first string 54 of resistors 56. Each transistor 50 from the first transistor-set 46 connects to the first string 54 at a different node between two resistors 56 along the string 54. As a result, current flowing through the transistor 50 causes a voltage at that node, the value of which depends on the series resistance between that node and ground. The resistances have the binary relationship shown in the figures. This results in a first-string voltage V4a at the top node of the first string 50 that depends on the digital value encoded in the first subset 18.

The interpolation stage 14 also includes a second string 58 of resistors 60 that mirrors the first string 54. Each transistor 52 in the second transistor-set 48 connects to the second string 58 at a different node between two resistors 60 along the string. As a result, current flowing through the transistor 52 causes a voltage at that node, the value of which depends on the series resistance between that node and ground. The resistances in the second string 58 mirror those in the first string 54. This results in a second-string voltage V4b having a value that is controlled by an output of a differential amplifier 36 that receives the first-string and second-string voltages V4a, V4b at its inverting and non-inverting inputs, respectively.

Figure 4:
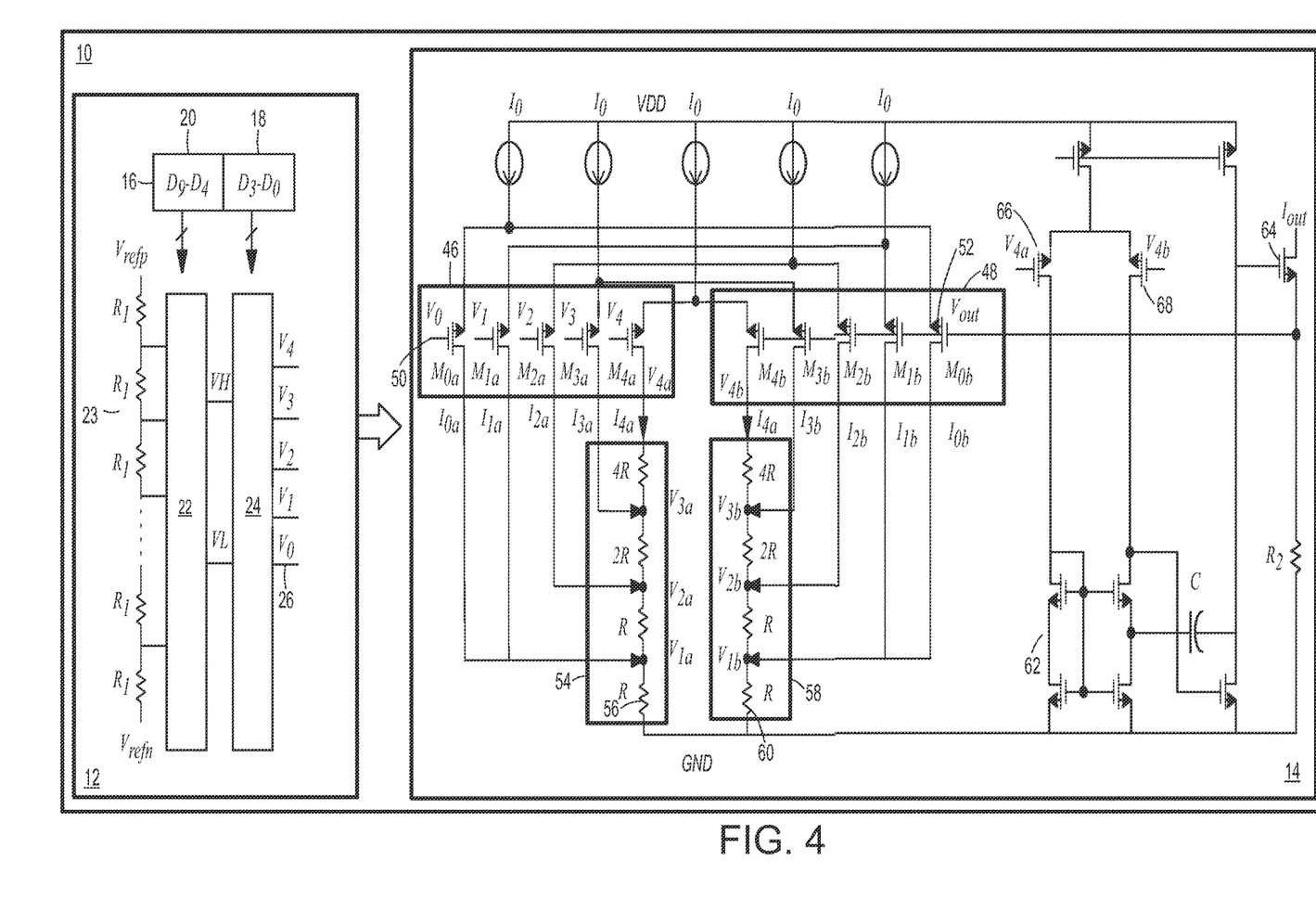
FIG. 4 shows a second embodiment of an interpolation stage.
Figure 5:
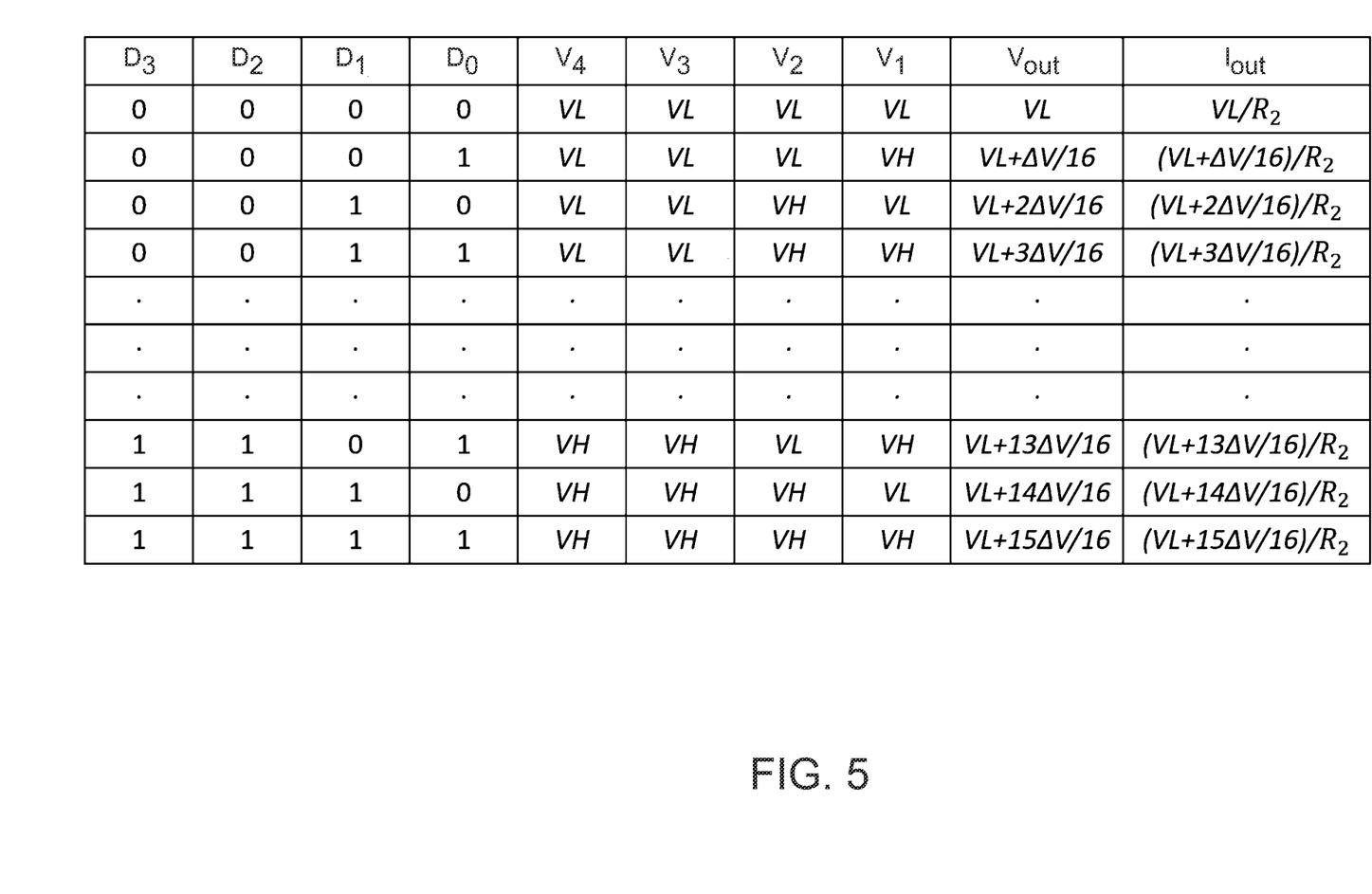
FIG. 5 shows a mapping similar to that shown in FIG. 2 but for the circuitry shown in FIG. 4.

An alternative embodiment, shown in FIG. 4, replaces the differential amplifier 36 with a gain stage 62 having an NMOS output transistor 64 through which flows an output drain current I$_{OUT}$. The amplitude of the output drain current indicates the digital value 16, as shown in the table in FIG. 5.

The gain stage 62 features first and second input transistors 66, 68 that are driven by corresponding first-string and second-string voltages V4a, V4b. This results in an output voltage V$_{OUT}$ at the output transistor's source terminal. The output voltage's value for a particular source current is determined in part by an output resistor R2. Tapping the output transistor's source terminal allows the output voltage V$_{OUT}$ to drive the transistors 52 in the second set 48, thus providing negative feedback in a manner analogous to that provided by the differential amplifier 36.

Figure 6:
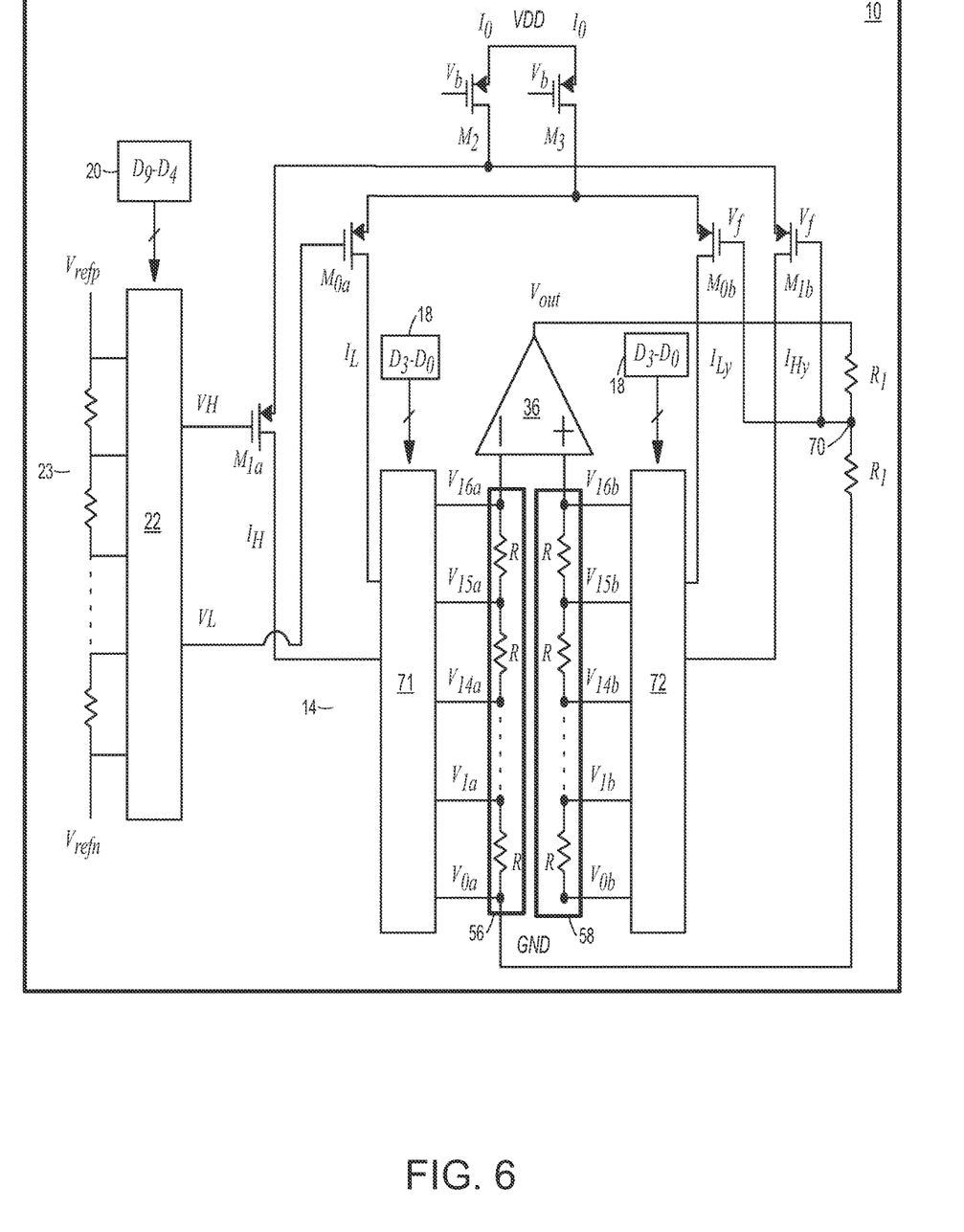
FIG. 6 shows an alternative interpolation stage.

FIG. 6 shows yet another embodiment of an interpolation stage 14. In the illustrated embodiment, the first analog voltage VH drives a first input transistor M1a and the second analog voltage VL drives a second input transistor M0a. The values of the first and second analog voltages VH, VL modulate corresponding first and second analog currents IH, IL. These first and second analog currents IH, IL are provided to a first multiplexer 71.

The first multiplexer 71 has several outputs. Each output of the first multiplexer 71 connects to a corresponding node along a first resistor string 56. Thus, by establishing a connection to two of these nodes, the multiplexer 71 defines a current path whose resistance depends on the number of resistors 56 between the nodes.

The first multiplexer 71 uses the value of the first subset 18 to select those nodes into which the first and second analog currents IH, IL are to be injected. This defines a voltage that is then provided to the inverting input of a differential amplifier 36.

The voltage at the differential amplifier's non-inverting input is derived from a feedback loop in which the differential amplifier's output voltage VOUT connects to ground via a voltage divider having first and second resistors R1. The voltage at the node 70 between the first and second resistors R1 defines a feedback voltage V$_f$ that modulates third and fourth analog currents ILy, IHy passing through third and fourth input transistors M0b, M1b. The third and fourth analog currents ILy, IHy, having been suitably modulated, are provided to a second multiplexer 72, which, like the first multiplexer 71, receives the value of the first subset 18.

The second multiplexer 72 operates much like the first multiplexer 71. It too has multiple outputs, though these connect to a second resistor string 58. The second multiplexer 72 uses the value of the first subset 18 to select into which nodes the third and fourth analog currents ILy, IHy will be injected. This defines another voltage, which is then provided to the differential amplifier's non-inverting input.

Having described the invention, and a preferred embodiment thereof, what we claim as new and secured by Letters Patent is:

1. An apparatus comprising a digital-to-analog converter that provides an analog output that represents a digital value, said digital value having a most-significant portion and a least-significant portion, wherein said digital-to-analog converter comprises a decoding stage and an interpolation stage, wherein said decoding stage defines upper and lower bounds and said interpolation stage outputs an interpolated value that is between said upper and lower bounds, wherein said decoding stage defines said upper and lower bounds based on said most-significant portion, wherein said interpolation stage selects said interpolated value based on said least-significant portion, wherein said interpolation stage comprises a plurality of current paths, each of which corresponds to an element of vector received from said decoding stage, wherein said current paths carry currents based on said elements of said vector, wherein each current path comprises a resistor, and wherein said resistors have different values of resistance.

2. The apparatus of claim 1, wherein said decoding stage comprises a decoder that is configured to output a high voltage and a low voltage, said high and low voltages defining said upper and lower bounds, respectively.

3. The apparatus of claim 1, wherein said decoding stage comprises a multiplexer that outputs a vector and wherein said multiplexer uses said least-significant portion as a basis for selecting which elements of said vector are to be set to said upper bound and which of said elements of said vector are to be set to said lower bound.

4. The apparatus of claim 1, wherein said decoding stage is configured to encode said least-significant portion into an output vector of voltages whose values are based on said most-significant portion.

5. The apparatus of claim 1, wherein said upper and lower bounds define a range, wherein said analog output is one of a set of analog values that are within said range, and wherein said analog values are separated by a step size that depends on the number of possible values of said least-significant portion.

6. The apparatus of claim 1, wherein said interpolation stage comprises first and second summation circuits having outputs that connect to inputs of a differential amplifier and wherein said first summation circuit outputs a voltage that is based on said least-significant portion and said second summation circuit outputs a voltage that is based on an output of said differential amplifier.

7. The apparatus of claim 1, wherein said interpolation stage comprises a summation circuit that outputs a sum of voltages at a plurality of nodes, wherein said nodes comprise a first node in series with a first resistance and a second node in series with a second resistance, wherein said first resistance exceeds said second resistance, wherein said first node is assigned to a first bit in said least-significant portion, wherein said second node is assigned to a second bit in said least-significant portion, and wherein first bit is of greater significance than said second bit, whereby, when a first current passes through said first node and a second current having the same value as said first current passes through said second node, voltages at said first and second nodes differ from each other.

8. The apparatus of claim 1, wherein said interpolation stage comprises a summation circuit that receives, at each input thereof, a voltage that depends on a value of a corresponding element of a vector defined by said least-significant portion.

9. The apparatus of claim 1, wherein said interpolation stage comprises a first summation circuit and a second summation circuit, wherein said first summation circuit receives, for each value of a voltage vector, a voltage that depends on a value of a resistance that is associated with a corresponding element of said voltage vector, and wherein said second summation circuit receives, at each input thereof, a voltage that depends at least in part on the value of said resistance.

10. The apparatus of claim 1, wherein said interpolation stage comprises first and second resistors, wherein a first current passes through said first resistor to generate a first voltage and a second current passes through said second resistor to generate a second voltage, and wherein said first current depends on a voltage at a first element of said vector and said second current depends on a voltage at a second element of said vector.

11. The apparatus of claim 1, wherein said interpolation stage comprises first and second resistors, wherein a first current passes through said first resistor to generate a first voltage and a second current passes through said first and second resistors to generate a second voltage that is greater than said first voltage, wherein said second resistor has a value that is double that of said first resistor, wherein said first current depends on a voltage of a first element of a vector and said second current has a value that depends on a voltage of a second element of said vector, and wherein said vector encodes said least-significant portion.

12. The apparatus of claim 1, wherein said interpolation stage comprises a differential amplifier, first summation circuitry, a first set of resistors and a first set of nodes, wherein each resistor in said first set of resistors has a resistance that corresponds to a significance of a bit in said least-significant portion, wherein, in operation, each node in said first set of nodes has a voltage value that depends on a value of a corresponding one of said bits in said least-significant portion and a significance of said bit, wherein said first summation circuitry is configured to provide a sum of said voltage values at said nodes to a first input of said differential amplifier, wherein said interpolation stage further comprises second summation circuitry, a second set of resistors, and a second set of nodes, wherein each resistor in said second set of resistors has a resistance that corresponds to a significance of a bit in said least-significant portion, wherein said second summation circuitry is configured to provide a sum of voltages at nodes in said second set of nodes to a second input of said differential amplifier, and wherein each node in said second set of nodes has a voltage value that depends on a current that is driven through a corresponding resistor that is connected to said node by a voltage provided by an output of said differential amplifier.

13. The apparatus of claim 1, wherein said interpolation stage comprises a string of resistors, wherein pairs of resistors in said string join at nodes, and wherein each of said nodes is configured to receive an injection of current based on a value of said least-significant portion.

14. The apparatus of claim 1, wherein said interpolation stage comprises a string of resistors, said string comprising resistors having different resistances, wherein said string comprises a node such that a resistance between said node and ground is the sum of all resistances of said resistors, and wherein a voltage measured at said node is indicative of a value of said least-significant portion.

15. The apparatus of claim 1, wherein said interpolation stage comprises a string and gates, wherein said string comprises a first resistor, a second resistor, a third resistor, a first node that is between said first resistor and said second resistor, and a second node that is between said second resistor and said third resistor, wherein each of said gates controls current flow through a corresponding transistor, wherein each of said gates is controlled by a corresponding element of a vector of analog values provided by said decoding stage, wherein said gates comprise a first gate and a second gate, wherein said first gate controls flow of current into said first node, wherein said second gate controls flow of current into said second node, and wherein flow of said current into said first and second nodes depends on a value encoded by said least-significant portion.

16. The apparatus of claim 1, wherein said interpolation stage comprises a current source, a differential amplifier, a first string, a first transistor-set, a second string, and a second transistor-set, wherein said first string comprises resistors and nodes between said resistors, wherein each resistor in said string has a resistance that corresponds to a significance of a bit in said least-significant portion, wherein said first transistor-set comprises transistors, each of which corresponds to a bit in said least-significant portion, wherein each transistor is configured to selectively inject current provided by said current source into a corresponding one of said nodes of said first string in response to a value of a corresponding bit in said least-significant portion, wherein a highest voltage in said first string is provided as a first input to said differential amplifier, wherein said second string comprises resistors and nodes between said resistors, wherein each resistor in said string has a resistance that corresponds to a significance of a bit in said least-significant portion, wherein said second transistor-set comprises transistors, each of which corresponds to a bit in said least-significant portion, wherein each transistor is configured to selectively inject current provided by said current source into a corresponding one of said nodes of said second string in response to an output of said differential amplifier, and wherein a highest voltage in said second string is provided as a second input to said differential amplifier.

17. The apparatus of claim 1, wherein said interpolation stage comprises a current source, a gain stage, a first string, a first transistor-set, a second string, and a second transistor-set, wherein said gain stage comprises first and second input transistors and an output transistor through which flows an output current that is indicative of said digital value, wherein said first string comprises resistors and nodes between said resistors, wherein each resistor in said string has a resistance that corresponds to a significance of a bit in said least-significant portion, wherein said first transistor-set comprises transistors, each of which corresponds to a bit in said least-significant portion, wherein each transistor is configured to selectively inject current provided by said current source into a corresponding one of said nodes of said first string in response to a value of a corresponding bit in said least-significant portion, wherein a highest voltage of said nodes in said first string drives a first input transistor of said gain stage, wherein said second string comprises resistors and nodes between said resistors, wherein each resistor in said string has a resistance that corresponds to a significance of a bit in said least-significant portion, wherein said second transistor-set comprises transistors, each of which corresponds to a bit in said least-significant portion, wherein each transistor is configured to selectively inject current provided by said current source into a corresponding one of said nodes of said second string in response to an output of said differential amplifier, wherein a highest voltage of said nodes in said second string drives a second input transistor of said gain stage, and wherein an output voltage at said output transistor's source terminal drives said transistors in said second transistor-set.

18. The apparatus of claim 1, wherein said interpolation stage comprises a differential amplifier, a first multiplexer, a second multiplexer, a first string, and a second string, wherein said first string comprises resistors and nodes between said resistors, wherein said first multiplexer receives first and second analog currents that correspond to said upper and lower bounds and receives said least-significant portion, wherein said first multiplexer comprises outputs, each of which connects to a corresponding one of said nodes in said first string, wherein a value encoded by said least-significant bits controls into which of said nodes of said first string said first and second currents are to be injected, thereby causing a voltage that is provided to an inverting input of said differential amplifier, wherein said second string comprises resistors and nodes between said resistors, wherein said second multiplexer receives said least-significant portion and third and fourth analog currents, said third and fourth analog currents corresponding to said first and second currents having been modulated by a voltage that depends on an output of said differential amplifier, and wherein the value encoded by said least-significant bits controls into which of said nodes of said second string said third and fourth currents are to be injected, thereby causing a voltage that is provided to a non-inverting input of said differential amplifier.

19. A method comprising converting a digital value into an analog value, said digital value having a most-significant portion and a least-significant portion, wherein converting said digital value into said analog value comprises selecting upper and lower bounds based on said most-significant portion and selecting said analog value by interpolating between said upper and lower bounds based on said least-significant portion, wherein interpolating between said upper and lower bounds based on said least-significant portion comprises causing each current path in a plurality of current paths to carry a corresponding current, wherein each of said current paths corresponds to an element of a vector that is received from a decoding stage that has defined said upper and lower bounds based on said most-significant portion of said digital value, wherein each of said current paths comprises a resistor, and wherein said resistors have different values of resistance.

20. An apparatus comprising a digital-to-analog converter that provides an analog output that represents a digital value, said digital value having a most-significant portion and a least-significant portion, wherein said digital-to-analog converter comprises a decoding stage and an interpolation stage, wherein said decoding stage defines upper and lower bounds and said interpolation stage outputs an interpolated value that is between said upper and lower bounds, wherein said decoding stage defines said upper and lower bounds based on said most-significant portion, wherein said interpolation stage selects said interpolated value based on said least-significant portion, wherein said interpolation stage comprises first and second resistors, wherein a first current passes through said first resistor to generate a first voltage and a second current passes through said second resistor to generate a second voltage, and wherein said first current depends on a voltage at a first element of said vector and said second current depends on a voltage at a second element of said vector.

* * * * *